United States Patent [19]

Neudeck

[11] Patent Number: 5,701,335
[45] Date of Patent: Dec. 23, 1997

[54] FREQUENCY INDEPENDENT SCAN CHAIN

[75] Inventor: Alexander J. Neudeck, Windsor, Colo.

[73] Assignee: Hewlett-Packard Co., Palo Alto, Calif.

[21] Appl. No.: 658,911

[22] Filed: May 31, 1996

[51] Int. Cl.$^6$ .................................................. G11C 19/00
[52] U.S. Cl. ............................ 377/69; 377/78; 377/80
[58] Field of Search ............................. 377/69, 77, 78, 377/80

[56] References Cited

U.S. PATENT DOCUMENTS

| | | | |
|---|---|---|---|
| 5,231,314 | 7/1993 | Andrews | 307/480 |
| 5,313,470 | 5/1994 | Simpson | 371/22.3 |
| 5,367,551 | 11/1994 | Okumura et al. | 377/80 |
| 5,530,706 | 6/1996 | Josephson et al. | 371/22.3 |

FOREIGN PATENT DOCUMENTS 358181321  10/1983  Japan ........................ 377/78

OTHER PUBLICATIONS

IEEE Std 1149.1–1990, IEEE Sandard Test Access Port And Boundary–Scan Architecture, available from The Institute of Electrical and Electronic Engineers, Inc., 345 East 47th Street, New York, NY 10017-2394.

Primary Examiner—Margaret Rose Wambach
Attorney, Agent, or Firm—Alexander J. Neudeck

[57] ABSTRACT

A shift register is clocked by propagating two clock networks in opposite directions: one from input towards the output, the other from the output towards the input. The parasitic delays at the end of these networks are picked to be approximately equal. An extra latch is added to the shift register where the two clock networks meet to prevent a race condition. Both clock networks consist of non-overlapping clocks. Non-overlapping clock generator circuits are used to restore the non-overlap of the clocks when parasitic effects start to cause clock overlap as the clocks are propagated over long distances. An extra latch in the shift register at the non-overlapping clock generators prevents the delay of the non-overlapping clock generator from causing a race condition.

13 Claims, 1 Drawing Sheet

FREQUENCY INDEPENDENT SCAN CHAIN

FIELD OF THE INVENTION

This invention relates to the electronic testing, design for testing, and debugging of digital integrated circuits. More particularly, this invention relates to serially scanning data through a test shift register. Even more particularly, this invention relates to serially scanning data through a boundary scan shift register being controlled by a test access port.

BACKGROUND OF THE INVENTION

A significant cost in electronics manufacturing and development is related to testing. Individual components must be tested and assembled systems must be tested. Testing may occur during product development to locate design errors and during manufacturing to detect manufacturing defects. Circuitry for testing is typically used in a special test mode, often under static conditions. That is, the test circuitry is used to sequence an integrated circuit through states specifically for testing and the results are monitored with the system clock slowed or paused. It is also common to include circuitry to capture the state of input/output signals (called boundary scan testing.) A commonly used standard for such circuitry is IEEE Std. 1149.1-1990, *IEEE Standard Test Access Port and Boundary-Scan Architecture*, available from The Institute of Electrical and Electronic Engineers, Inc., 345 East 47th Street, New York, N.Y. 10017-2394. IEEE Std. 1149.1 defines a standard serial interface through which test instructions and test data are communicated. The technique involves the inclusion of a shift-register stage adjacent to each component pin of interest so that signals at component boundaries can be controlled and observed. The special shift-registers and test instructions can be used in isolated component testing and debugging, and in testing and debugging individual components assembled into larger systems.

The data used to test a given circuit is held in the slave of a master-slave latch. These master-slave latches are connected in series, the output of one to the input of the next, to form a shift-register (also known as a scan chain.) A pair of non-overlapping clocks (shift clocks or scan clocks) is then used to move the data from the input of the shift-register to its desired location. The frequency of these clocks is called the scan frequency. Results of the test may also be loaded into a given latch and shifted to the output of the shift-register in the same manner.

Most of the time testing a chip is spent just shifting data into, and results out of, the chip. Therefore, the scan frequency drastically effects how long it takes to test a part. The faster a part can be scanned, the less time it will take to test. Accordingly, the faster pars can be tested, the less labor and equipment is needed to test a given number of parts. From that it follows that the faster parts can be tested, the less expensive they will be to manufacture.

The shift clocks must be non-overlapping (i.e. one must be at a logical low before the other goes to a logical high) to prevent data from "racing" through from the master (or slave) of one latch, through its slave (or master) and into the master (or slave) of the next. If this happens, the data that was in that latch is lost. One way for the shift clocks to overlap is due to the parasitic effects of series resistance, line capacitance, and load capacitance. This is often called RC delay. The shift clocks may, at their source, be non-overlapping. But if they are routed for a long enough distance, these parasitic effects increase the rise and fall time of these signals at remote locations. That degradation can lead to a condition where one clock has not yet fallen completely before the other starts to rise. In other words, they overlap.

The shift clocks are distributed everywhere the scan chain goes. Accordingly, they are routed to very remote parts of the chip. This almost inevitably leads to large RC delays and overlapping shift clocks. The problem is worse with very fast IC processes where the amount of non-overlap (i.e. the dead time between the shift clocks) is very small, the threshold of the master-slave input FETs is very low (as in a fast IC process), and the delay through a latch is very fast. In addition, as FET speed increases, it has no effect on the metal resistance and capacitance. Therefore, a scan chain that works with slow FETs, may not work in a faster process. IC process shrinks, which speed up FETs, but increase metal R and C, further aggravate this problem.

Furthermore, when a low frequency scan clock is used, the scan clocks are able to propagate around the entire chip in one clock cycle before the data out of the last latch is captured by the tester. If a high frequency clock is used, the RC delays in the scan clock network may prevent the scan clocks from being able to propagate around the entire chip in one scan clock cycle. Accordingly, when the tester samples the output of the last latch in the scan chain, that latch may not have been clocked yet. Therefore, the data that the tester samples is from a previous scan clock cycle. A scan chain whose output is dependent on the scan clock frequency is undesirable since it requires different test vectors for different scan frequencies. It also requires that the software used to generate test vectors know the frequency of scan clock. Furthermore, the tester would need to know, in advance, whether this was a fast part or a slow part in order to choose the correct scan frequency for the device under test. Otherwise, it would not be able to pick the correct vectors to test the chip.

There is a need for a scan chain clocking system which maintains non-overlapping scan clocks to remote areas of the scan chain. There is a need for a scan chain clocking system which may be clocked at vastly different scan clock frequencies and produce the same outputs from the scan chain.

SUMMARY OF THE INVENTION

The invention propagates two sets of scan clocks along a scan chain. One set is propagated in the direction of data flow, from the input of the scan chain towards the output. The other set is propagated against the direction of data flow, from the output of the scan chain towards the input. The clocking of the scan chain switches from the scan clocks propagated with the direction of data flow to the scan clocks propagated against the data flow at the point along the scan chain where both sets of scan clocks have approximately the same delay from their source. This point is also the point where both sets of scan clocks are at their maximum delay. Accordingly, after the switch from clocks propagating with the direction of data flow, to clocks propagating against data flow, the delay in clocking the scan chain is gradually canceled out, reaching zero delay by the end of the scan chain. The non-overlapping properties of both sets of clocks are restored by non-overlapping clock generators at regular intervals. Extra latches are inserted in the scan chain to prevent race conditions between latches that are clocked by a restored scan clock and those that are clocked by a non-restored clock. An extra latch is also inserted to prevent a race condition between latches which are clocked by the two different sets of scan clocks.

DETAILED DESCRIPTION OF THE PREFERRED EMBODIMENTS

Figure 1:
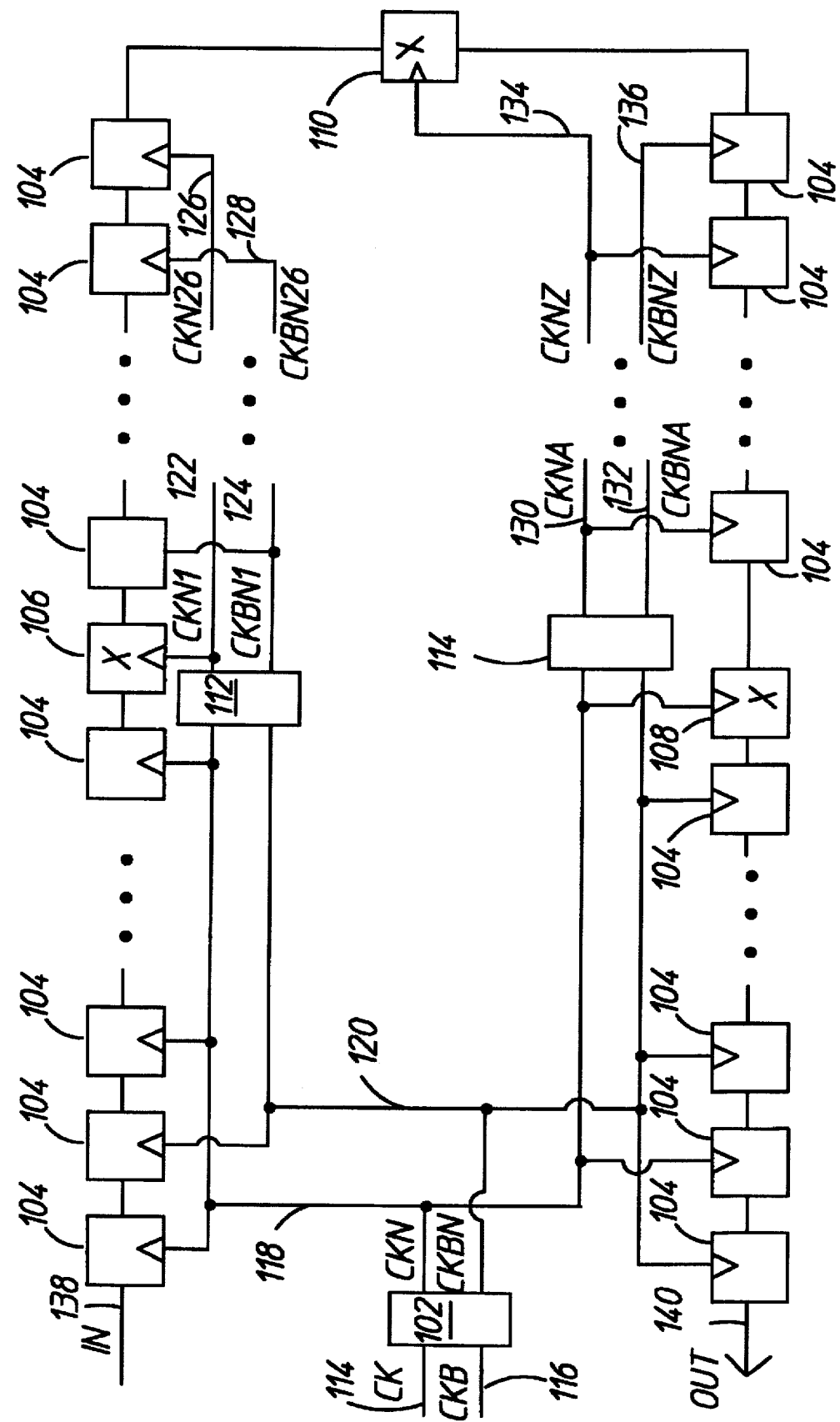
FIG. 1 illustrates a frequency independent scan chain according to a preferred embodiment of the invention.

FIG. 1 illustrates a frequency independent scan chain. The clock signals CK 114 and CKB 116 are supplied by external circuitry to shift data through the scan chain. CKB 116 is the complement of CK 114. Because of jitter, skew, and parasitic effects, CK 114 and CKB 116 may overlap. CK 114 and CKB 116 are input to a non-overlapping clock generator circuit 102. A non-overlapping clock generator takes two complementary clocks which may or may not overlap, and generates two complementary clocks which do not overlap. A non-overlapping clock generator suitable for use in the present invention is shown in FIG. 3 of U.S. patent application Ser. No. 08/539,382, Josephson et al. Other circuits which take overlapping complementary clocks and produce non-overlapping complementary clocks may also be used.

The outputs of the non-overlapping clock generator 102 are CKN 118 and CKBN 120. The scan chain is made up of transparent latches 104. The transparent latches 104 are connected in series (the output of one going to the input of the next) to form a shift register. The input to the scan chain is labeled IN 138. The output is labeled OUT 140.

Starting at the input node, IN 138, and proceeding along the scan chain, note that the transparent latches 104 are alternately connected to CKN 118 and CKBN 120. One branch of the CKN 118 and CKBN 120 network is routed from its source at the non-overlapping clock generator 102 along the scan chain in the direction of data flow. Because any two successive latches in the scan chain are connected to two different clocks which do not overlap, any two latches in series with one another in the scan chain form a master/slave pair. As long as CKN 118 and CKBN 120 do not overlap, the data fed into the input of the scan chain, IN 138, is shifted serially down the scan chain towards the output OUT 140 at the rate of two transparent latches 104 per cycle of CKN 118 and CKBN 120. If, however, CKN 118 and CKBN 120 overlap, the clock inputs to two adjacent transparent latches 104 in the scan chain will be active at the same time. This will allow data to "race" from the input of the first latch to the input of the second latch. This will cause the second latch to store the data that was at the input of the first latch instead of the data that was originally held in the first latch. Therefore, the data that was in the first latch is lost.

As discussed above, when CKN 118 and CKBN 120 are routed a very long distance, parasitic RC effects cause these signals to begin to overlap. Before they overlap enough to cause a race condition, these CKN 118 and CKBN 120 are input to a non-overlapping clock generator 112. The outputs of this non-overlapping clock generator are CKN1 122 and CKBN1 124. The delay through the non-overlapping clock generator 112 can cause a race condition between the last latch in the chain to be clocked by CKN 118 and the first latch to be clocked by CKBN1 124. To prevent this from occurring, an extra latch 106 is included in the scan chain which is clocked by CKN1 122. This extra latch 106 takes its input from the last latch to be clocked by CKN 118 and feeds its output to the input of the first latch to be clocked by CKBN1 124. As the scan chain propagates around the chip, a non-overlapping clock generator and an extra latch are added whenever it is necessary to prevent overlapping clocks from causing a race condition. The multiple restorations of the shift clocks propagating along the scan chain in the direction of the data flow is shown by the signals labeled CKN26 126 and CKBN26 128 on FIG. 1.

A second branch of the CKN 118 and CKNB 120 network is routed from its source at the non-overlapping clock generator 102 along the scan chain opposite the direction of data flow. (I.e. from the output of the scan chain towards the input.) When CKN 118 and CKBN 120 are routed a very long distance, parasitic RC effects cause these signals to begin to overlap. Before they overlap enough to cause a race condition, CKN 118 and CKBN 120 are input to a non-overlapping clock generator 114. The outputs of this non-overlapping clock generator are CKNA 130 and CKBNA 132. The delay through the non-overlapping clock generator 114 can cause a race condition between the last latch in the chain to be clocked by CKNA 130 and the first latch to be clocked by CKBN 120. To prevent this from occurring, an extra latch 108 is included in the scan chain which is clocked by CKNA 130. This extra latch 108 takes its input from the last latch to be clocked by CKNA 130 and feeds its output to the input of the first latch to be clocked by CKN 118. As the scan chain propagates around the chip, a non-overlapping clock generator and an extra latch are added whenever it is necessary to prevent overlapping clocks from causing a race condition. The multiple restorations of the shift clocks propagating along the scan chain in the direction opposite the data flow is shown by the signals labeled CKNZ 134 and CKBNZ 136 on FIG. 1.

Since one set of non-overlapping clocks is being propagated and restored in the direction of data flow, and one set of non-overlapping clocks is being propagated and restored opposite the data flow, these two clock networks will eventually meet somewhere along the scan chain. At this point, the RC delays, and the delays associated with the non-overlapping clock generators will have skewed both sets of clock signals considerably later than their original timing as they were output from the first non-overlapping clock generator 102. Furthermore, the delay of the scan clocks propagating in the direction of data flow may not match the delay associated with the scan clocks propagating against the direction of data flow. Therefore, to prevent a race condition between the last latch clocked by the scan clocks propagating in the direction of data flow, and the next latch in the chain, (which is clocked by scan clocks which were propagated against the direction of data flow) an extra latch 110 is needed to prevent a race condition. The extra latch 110 takes its input from the last latch in the scan chain which was clocked by scan clocks propagating in the direction of data flow. This last latch is shown on FIG. 1 being clocked by CKN26 126. The extra latch 110 is shown as being clocked by CKNZ 134. The output of the extra latch 110 feeds a latch clocked by CKBNZ 136. Note that the extra latch and its predecessor in the scan chain are clocked by two scan clocks with the same polarity, CKNZ 134 and CKN26 122. This is similar to the extra latches, 106 and 108, placed at the non-overlapping clock generators, 112 and 114, and serves the same purpose. As long as CKNZ 134 and CKN26 122 overlap, data will be able to flow across the boundary between the two clock domains. Therefore, to ensure that CKNZ 134 and CKN26 122 overlap, the transition between clock domains should be placed where the delay from the non-overlapping clock generator 102 to the last latch clocked by scan clocks propagating in the direction of the data flow is approximately equal to the delay from the non-overlapping clock generator 102 to the first latch clocked by scan clocks propagating opposite the direction of the data flow.

Consider now, the scan chain being clocked at different frequencies, one slow and one fast. When the scan chain is being clocked at a very slow frequency, 1 kHz for example, each clock signal CK 114 or CKB 116 is high for a very long time. Since these signals are high for a very long time, there is plenty of time for that high level to propagate through the parasitic RC delays and the gate delays of the non-overlapping clock generators. Accordingly, the entire scan chain will see these high levels during the same clock cycle and data will move through the scan chain in an orderly manner.

If, however, the scan chain is clocked at a very high frequency, CK 114 and CKB 116 will be high for only a very short period of time. If the parasitic RC delays and the gate delays of the non-overlapping clock generators are greater than the time either CK 114 or CKB 116 are active, the scan clock pulse will be only partially propagated down the scan chain when the next clock pulse begins. For a conventional scan chain, this would mean that the last latch in the scan chain had not yet been clocked when its output was expected. Therefore, in a conventional scan chain, the output out of the last latch in the scan chain would be different depending on whether the scan clock frequency was high or low.

In the present invention, however, two sets of clocks are propagated in opposite directions along the scan chain. As one set of clocks is propagated in the direction of data flow, it becomes more and more delayed from the original scan clocks. This delay may become so great that the last latch to be clocked in this clock domain may be getting its clock pulses after several more clock pulses have been launched at the beginning of the scan chain. Now, the scan chain switches clock domains from clocks propagating in the direction of data flow to clocks propagating against the direction of data flow. At this point, both sets of scan clocks are at their maximum delay point. Now, because the clocks are propagating against the direction of data flow, and delay increases in the direction of propagation, each successive latch in the scan chain is clocked by a clock with less delay than the previous latch. Eventually, the last latch in the scan chain is being clocked with the same timing as the first latch in the scan chain. Therefore, since the first and last latch are clocked with the same timing, the data output from the scan chain is independent of the scan clock frequency. This is true even if some of the latches in the middle of the scan chain were clocked several cycles later than the beginning and end latches of the chain.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the particular use contemplated. It is intended that the appended claims be construed to include other alternative embodiments of the invention except insofar as limited by the prior art.

What is claimed is:

1. A frequency independent shift register, comprising:
    a first plurality of latches, the first plurality of latches serially connected as a shift register having a first input, a first output, and a first direction of data flow from the first input to the first output;
    a first clocking means, the first clocking means being propagated in the first direction of data flow and coupled to the first plurality of latches;
    a second plurality of latches, the second plurality of latches serially connected as a shift register having a second input which is coupled to the first output, a second output, and a second direction of data flow from the second input to the second output and
    a second clocking means, the second clocking means being propagated opposite the second direction of data flow and coupled to the second plurality of latches.

2. The shift register of claim 1 wherein the first clocking means further comprises a first pair of non-overlapping clock signals and the second clocking means further comprises a second pair of non-overlapping clock signals.

3. The shift register of claim 2 wherein the first clocking means is propagated by at least one non-overlapping clock generator and the second clocking means is propagated by at least one non-overlapping clock generator.

4. The shift register of claim 3 wherein the second input is coupled to the first output by a race stopping latch.

5. The shift register of claim 4 wherein the race stopping latch is connected to the second clocking means.

6. The shift register of claim 5 wherein the first clocking means and the second clocking means are coupled to a common source.

7. The shift register of claim 6 wherein for each non-overlapping clock generator propagating the first clocking means there is first extra latch serially connected in the first plurality of latches and coupled to a first output of that non-overlapping clock generator.

8. The shift register of claim 7 wherein for each non-overlapping clock generator propagating the second clocking means there is second extra latch serially connected in the second plurality of latches and coupled to a first input of that non-overlapping clock generator.

9. A method of clocking a shift register, the shift register comprising a plurality of latches, an input, an output, and having a direction of data flow from the input to the output, the method comprising:
    propagating a first clocking means in the direction of data flow and
    propagating a second clocking means opposite the direction of data flow.

10. The method of claim 9, further comprising the steps of:
    coupling the first clocking means, the first clocking means having a first maximum delay and the second clocking means having a second maximum delay, to a first portion of the plurality of latches so that the first maximum delay approximates the second maximum delay, and;
    coupling the second clocking means to a second portion of the plurality of latches, the second portion of the plurality of latches being those plurality of latches which are not coupled to the first clocking means.

11. The method of claim 10 wherein the first clocking means and the second clocking means are coupled to a common source.

12. The method of claim 11 wherein the first clocking means is comprised of a pair of non-overlapping clock signals and the second clocking means is comprised of a pair of non-overlapping clock signals.

13. The method of claim 12 wherein the common source is a test access port.

* * * * *